(12) United States Patent
Hamlin

(10) Patent No.: US 6,769,097 B2
(45) Date of Patent: Jul. 27, 2004

(54) SCALE-INVARIANT TOPOLOGY AND TRAFFIC ALLOCATION IN MULTI-NODE SYSTEM-ON-CHIP SWITCHING FABRICS

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/185,740

(22) Filed: Jun. 27, 2002

(65) Prior Publication Data

US 2004/0003354 A1 Jan. 1, 2004

(51) Int. Cl.[7] .............................................. G06F 17/50
(52) U.S. Cl. .................................. 716/1; 716/2; 716/8
(58) Field of Search ............................. 716/1–2, 7–11, 716/16–18; 706/13

(56) References Cited

U.S. PATENT DOCUMENTS

| | | | |
|---|---|---|---|
| 5,557,533 A | * 9/1996 | Koford et al. ................. 716/9 |
| 6,360,191 B1 | * 3/2002 | Koza et al. ..................... 703/6 |
| 6,526,556 B1 | * 2/2003 | Stoica et al. .................. 716/16 |
| 6,574,783 B1 | * 6/2003 | Zhuang et al. ................. 716/8 |
| 6,578,176 B1 | * 6/2003 | Wang et al. ................... 716/2 |
| 2001/0032029 A1 | * 10/2001 | Kauffman ..................... 700/99 |

* cited by examiner

Primary Examiner—Vuthe Siek
Assistant Examiner—Paul Dinh
(74) Attorney, Agent, or Firm—Suiter-West PC LLO

(57) ABSTRACT

The present invention is directed to a scale-invariant topology and traffic allocation in multi-node system-on-chip switching fabrics. A method for allocating resources in a design of an integrated circuit may include receiving resource data for components of an integrated circuit. The resource data is suitable for indicating consumption by the components of at least one resource. Integrated circuit resources for the components of the integrated circuit are allocated according to a power law distribution as applied to the received resource data.

20 Claims, 3 Drawing Sheets

SCALE-INVARIANT TOPOLOGY AND TRAFFIC ALLOCATION IN MULTI-NODE SYSTEM-ON-CHIP SWITCHING FABRICS

CROSS REFERENCE TO RELATED APPLICATIONS

The present application hereby incorporates the following U.S. patent applications by reference in their entirety:

| Attorney Docket Number | Ser. No. | Filing Date |
| --- | --- | --- |
| LSI 01-390 | 10/015,194 | Nov. 20, 2001 |
| LSI 01-488 | 10/021,414 | Oct. 30, 2001 |
| LSI 01-489 | 10/021,619 | Oct. 30, 2001 |
| LSI 01-490 | 10/021,696 | Oct. 30, 2001 |
| LSI 01-524B | 10/044,781 | Jan. 10, 2002 |
| LSI 01-543 | 10/135,189 | Apr. 30, 2002 |
| LSI 01-695 | 09/842,335 | Apr. 25, 2001 |
| LSI 01-827 | 10/034,839 | Dec. 27, 2001 |
| LSI 01-828B | 10/061,660 | Feb. 1, 2002 |
| LSI 02-0166 | 10/135,869 | Apr. 30, 2002 |
| LSI 02-4372 | 10/186,263 | Jun. 27, 2002 |

FIELD OF THE INVENTION

The present invention generally relates to the field integrated circuits, and particularly to a scale-invariant topology and traffic allocation in multi-node system-on-chip switching fabrics.

BACKGROUND OF THE INVENTION

Integrated circuit design and implementation is becoming more and more complex as the functionality and size of the circuits increase. A variety of users and manufacturers of devices utilizing integrated circuits desire an increasing array of functionality and performance in lower cost devices. Therefore, to comply with this mandate, producers of integrated circuit must become more efficient in the design and optimization of the circuits to ensure competitive positioning of their products.

One such area for optimization includes organization and routing of the components of the integrated circuit. As the number of components increase, the complexity of routing between the functional blocks even further increases.

For example, high complexity semiconductor devices, such as system-on-chip devices and the like, may be organized as networks or interconnected patterns of functional blocks. An important issue in the design of such complex system-on-chip integrated circuits is the optimal allocation of path attributes among the elements making up the fabric. However, because of the vast complexity of these devices due to the number of components, designs may be realized to provide desired functionality but may not be the most optimal solution.

Therefore, it would be desirable to provide a system and method for a scale-invariant topology and traffic allocation in multi-node system-on-chip switching fabrics.

SUMMARY OF THE INVENTION

Accordingly, the present invention is directed to a scale-invariant topology and traffic allocation in multi-node system-on-chip switching fabrics. In a first aspect of the present invention, a method for allocating resources in a design of an integrated circuit includes receiving resource data for components of an integrated circuit. The resource data is suitable for indicating consumption by the components of at least one resource. Integrated circuit resources for the components of the integrated circuit are allocated according to a power law distribution as applied to the received resource data.

In an additional aspect of the present invention, a method for allocating resources in a design of an integrated circuit includes receiving resource data for components of an integrated circuit. The resource data is suitable for indicating consumption by the components of at least one resource. Integrated circuit resources for the components of the integrated circuit are allocated according to a power law distribution as applied to the received resource data. The allocation of integrated circuit resources is optimized by utilizing a genetic algorithm.

In a further aspect of the present invention, a system for allocating resources in a design of an integrated circuit includes a memory suitable for storing a program of instructions and a processor suitable for performing a program of instructions. The program of instructions configures the processor to receive resource data for components of an integrated circuit. The resource data is suitable for indicating consumption by the components of at least one resource. Integrated circuit resources for the components of the integrated circuit are allocated according to a power law distribution as applied to the received resource data.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
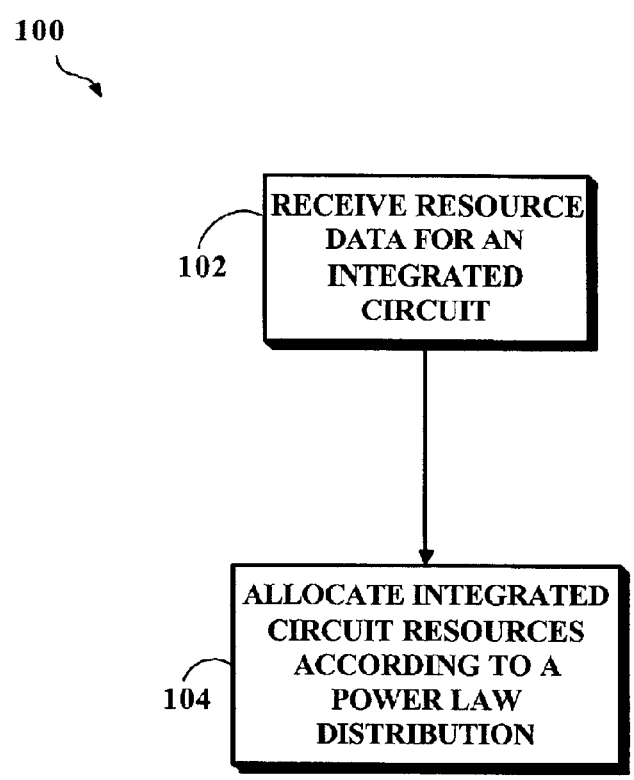
FIG. 1 is a flow diagram of an embodiment of the present invention wherein a power law distribution is utilized for resource allocation of integrated circuit resources.
Figure 2:
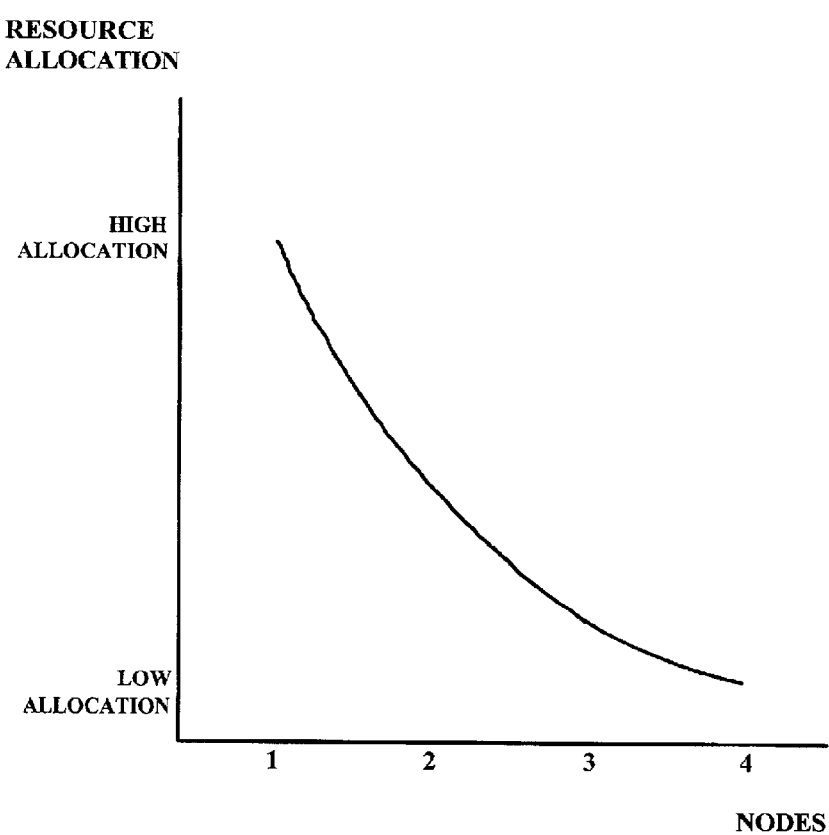
FIG. 2 is a graphical illustration of a power law distribution.
Figure 3:
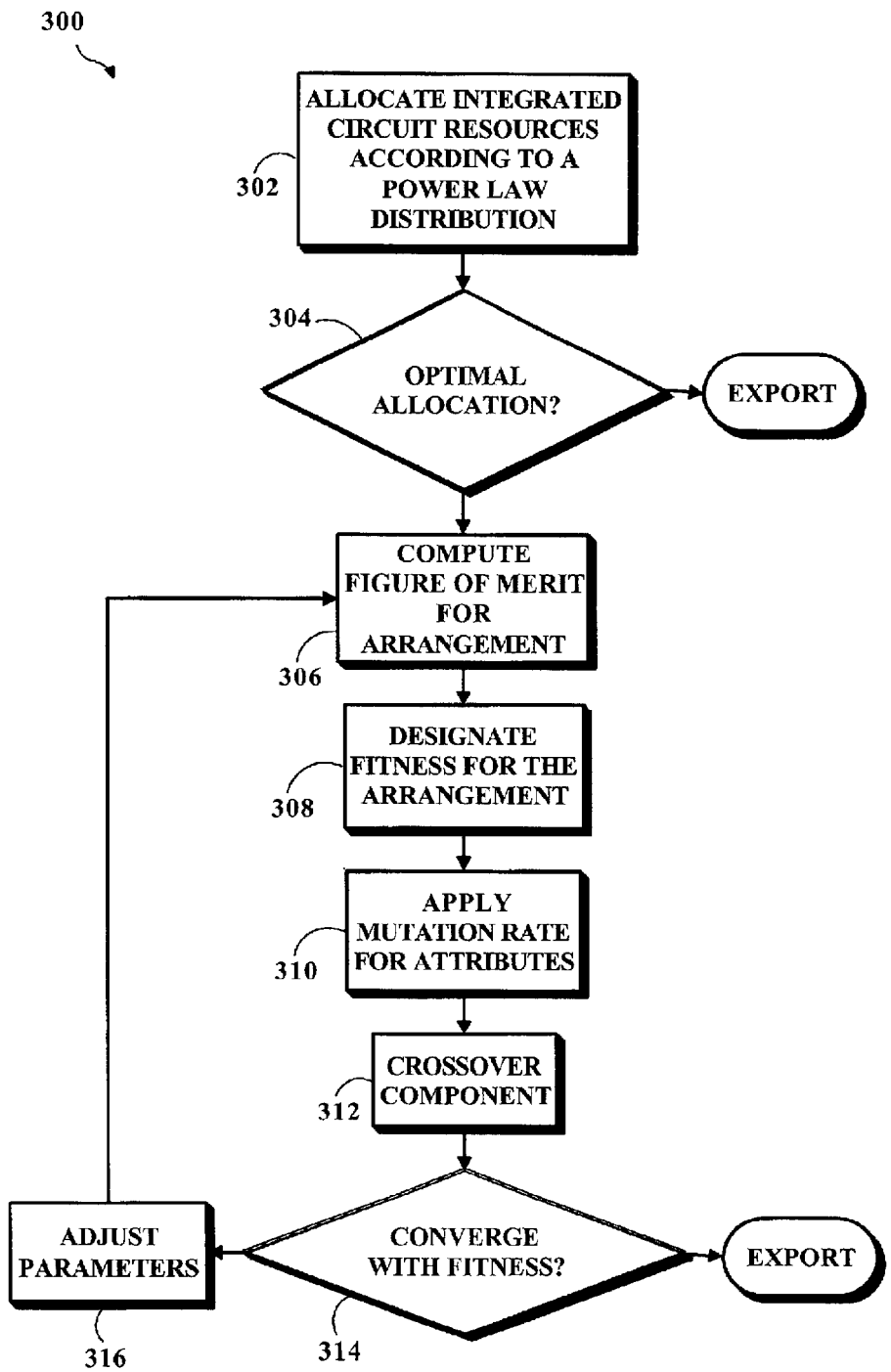
FIG. 3 is a flow diagram of an exemplary embodiment of the present invention wherein an initial allocation is utilized according to power law distributions and a genetic algorithm employed for optimizing the result.

Referring generally now to FIGS. 1 through 3, exemplary embodiments of the present invention are shown. High complexity semiconductor devices may be organized as networks or interconnected patterns of functional blocks. One such organization has been termed a 'sea-of-platforms', referring to the idea that multiple 'platforms' (which may includes processors, programmable logic, gate array blocks, standard cell IP blocks, memory blocks, and the like) may usefully be organized in interconnection patterns described by switching fabric heuristics and algorithms.

Other functional units besides 'platforms' may also be structured in interconnected sets of nodes arranged within a switching fabric, and may be termed 'sea-of-modules', 'sea-of-adders', 'sea-of-ALUs', and the like.

In some instances, the elements making up the "sea" of nodes may be assembled into a regular pattern of communicative links or paths whose structure or topology is usually regular and whose path definitions are determined by well-known switching algorithms. An important issue in the design of such complex system-on-chip integrated circuits is the optimal allocation of path attributes among the elements making up the fabric. Therefore, the present invention provides a system and method for optimal allocation.

A variety of methods have been used to specify the topology and arrangement of the nodes and paths in interconnection networks for system-on-chip architectures. For example, hypercubes or hypertoroi have often been employed to describe the links joining the nodes of such networks. Once the basic structure is defined, it is also necessary to allocate attributes such as bandwidth, latency, power, addresses, priorities, jitter and encoding to each of the path links and nodes in the network. Typically, switching elements residing in each of the nodes are employed to steer traffic within the fabric, and exogenous algorithms may apply constraints or priorities to one or more nodes or sets of nodes in order to dictate bandwidth and quality of service characteristics, for example.

In the present invention an alternative allocation principle is disclosed. Through use of the present invention, resource allocations within the system-on-chip integrated circuit's switching fabric follow power law distributions, according to which nodes' consumption of any scarce resource, whether it be bandwidth, power, latency, addressing space or the like, be dictated by the principle that these attributes and resources, and the nodes consuming them, are distributed as some power(s) of the attribute in questions.

Referring now to FIG. 1, an exemplary method 100 of the present invention is shown wherein a power law distribution is utilized for resource allocation of integrated circuit resources. Resource data, which may include attributes, for an integrated circuit is received 102. For instance, the resource data may include addressing space, power, addressing, throughput-and-bandwidth, latency, quality of service, coding gain, error susceptibility, or other properties of interest capable of expression as a power of some scalar value and the like as contemplated by a person of ordinary skill in the art. Resources are then allocated for the integrated circuit based on the received resource data according to a power law distribution 104. In this way, resources may be apportioned in a scalable and efficient manner.

So, for example, the bandwidth over the entire set of nodes may be allocated such that the difference between the topmost one-fourth of nodes and the bottommost one-fourth of nodes are at a power of four (as opposed to a linear scale), as shown in FIG. 2.

Such power-law networks have been shown to be scale-invariant, and thus have the highly desirable property that the networks may scale from small instantiations to very large instantiations without loss of the essential properties the networks exhibit at any scale of interest.

A sea-of-platform design based upon this invention may employ a power law algorithm to allocate nodes and bandwidth, for instance, in order to maximize the total throughput of the chip and minimize the area consumed by interconnect wiring (in part because narrow paths would be used between the more sparsely connected and less bandwidth-intensive nodes).

In the present invention, the power-law principle may be applied independently to each attribute or criterion affecting the nodes making up the fabric. Thus separate applications of the power-law allocation principle could be made for each of the power, addressing, throughput-and-bandwidth, latency, quality of service, coding gain, error susceptibility, or other properties of interest capable of expression as a power of some scalar value.

Such an allocation principle represents a first solution to the optimal design problem. In order to more nearly approximate an ideal allocation of scarce resources in a system-on-chip integrated circuit based on a switching fabric, it is desirable to optimize all of the independently allocated attributes globally, that is taking account of one another even as each is held to obey a power-law principle.

In order to do this, it is desirable to discover that pattern of nodes such that no other combination of topology and attribute allocation could improve on the overall "fitness" of the allocations for each attribute taken singly.

The present invention contemplates the use of a genetic programming algorithm to discover the optimal arrangement of nodes in a switch topology. For example, referring now to FIG. 3, an exemplary method 300 of the present invention is shown wherein an initial allocation is utilized according to power law distributions and a genetic algorithm employed for optimizing the result. An initial allocation of a resource according to power law principles is made 302. After an initial allocation according to power-law principles of each attribute of interest is made; the aggregate may be found to be sub-optimal 304.

The aggregate may then be optimized according to a genetic algorithm. A figure of merit for the arrangement is computed 306, and is designated the fitness for that arrangement 308.

A mutation rate is applied to the values for each attributed under consideration 310, and a crossover component determines the degree to which changes induced in each of the attributes' arrangements are permitted to affect the adoption of mutations in succeeding generations 312. Mutation is beneficial in exploring the search space, in this case, optimal solutions. Through making small moves, mutation allows a search space to be explored in a less disruptive way versus employing a crossover and helps to maintain diversity. For example, mutation helps prevent a population from correlating. Crossover may involve combining solutions, such as through a child produced by combining solutions from its "parents". Preferably, a child is produced from parents having a similar "fitness". Crossover may include single-point crossover, multi-point crossover, uniform crossover, bit simulated crossover, problem-centered crossover, specialized crossover, and the like as contemplated by a person of ordinary skill in the art.

The whole is executed iteratively in line with general understood practices for genetic algorithms, and convergence is sought 314 within some convenient limiting number of generations. For example, the number of generations may be chosen based on correlation of successive generations, time taken to perform, and the like without departing from the spirit and scope of the present invention.

If satisfactory convergence is not achieved, the mutation, crossover, and other parameters are adjusted 316, and the process is repeated. Common practice indicates that arrangements will be revealed whose allocations of attributes' resources more and more closely approach an ideal arrangement and allocation.

This set of allocations is then used as input to the device design methodology whereby the system-on-chip thus optimized is reduced to practice. It should be realized by a person of ordinary skill in the art that both genetic algorithms and genetic program are contemplated by the present invention and as described as a genetic algorithm in the previous examples, as well as other evolutionary strategies without departing from the spirit and scope thereof.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for allocating resources in a design of an integrated circuit, comprising:

receiving resource data for components of an integrated circuit, the resource data suitable for indicating consumption by the components of at least one resource; and allocating integrated circuit resources for the components of the integrated circuit according to a power law distribution as applied to the received resource data.

2. The method as described in claim 1, further comprising optimizing the allocation of integrated circuit resources by utilizing a genetic algorithm.

3. The method as described in claim 2, wherein the genetic algorithm employs at least one of mutation and crossover.

4. The method as described in claim 2, wherein the allocation of integrated circuit resources is optimized by the genetic algorithm by taking into account at least two resources.

5. The method as described in claim 2, wherein a determination is made as to whether convergence with fitness is achieved, and if not, adjusting the genetic algorithm.

6. The method as described in claim 1, wherein the resource includes at least one of power, addressing space, addressing, throughput, bandwidth, latency, coding gain and error susceptibility.

7. The method as described in claim 1, wherein the resource includes a property of interest being expressed as a power of a scalar value.

8. A method for allocating resources in a design of an integrated circuit, comprising:

receiving resource data for components of an integrated circuit, the resource data suitable for indicating consumption by the components of at least one resource;

allocating integrated circuit resources for the components of the integrated circuit according to a power law distribution as applied to the received resource data; and optimizing the allocation of integrated circuit resources by utilizing a genetic algorithm.

9. The method as described in claim 8, wherein the genetic algorithm employs at least one of mutation and crossover.

10. The method as described in claim 8, wherein the allocation of integrated circuit resources is optimized by the genetic algorithm by taking into account at least two resources.

11. The method as described in claim 8, wherein a determination is made as to whether convergence with fitness is achieved, and if not, adjusting the genetic algorithm.

12. The method as described in claim 8, wherein the resource includes at least one of power, addressing space, addressing, throughput, bandwidth, latency, coding gain and error susceptibility.

13. The method as described in claim 8, wherein the resource includes a property of interest being expressed as a power of a scalar value.

14. A system for allocating resources in a design of an integrated circuit, comprising:

a memory suitable for storing a program of instructions; and a processor suitable for performing a program of instructions, wherein the program of instructions configures the processor to receive resource data for components of an integrated circuit, the resource data suitable for indicating consumption by the components of at least one resource; and allocate integrated circuit resources for the components of the integrated circuit according to a power law distribution as applied to the received resource data.

15. The system as described in claim 14, further comprising optimizing the allocation of integrated circuit resources by utilizing a genetic algorithm.

16. The system as described in claim 15, wherein the genetic algorithm employs at least one of mutation and crossover.

17. The system as described in claim 15, wherein the allocation of integrated circuit resources is optimized by the genetic algorithm by taking into account at least two resources.

18. The system as described in claim 15, wherein a determination is made as to whether convergence with fitness is achieved, and if not, adjusting the genetic algorithm.

19. The system as described in claim 14, wherein the resource includes at least one of power, addressing space, addressing, throughput, bandwidth, latency, coding gain and error susceptibility.

20. The system as described in claim 14, wherein the resource includes a property of interest being expressed as a power of a scalar value.

* * * * *